(12) United States Patent
Anderson et al.

(10) Patent No.: US 7,816,738 B2
(45) Date of Patent: Oct. 19, 2010

(54) LOW-COST FEOL FOR ULTRA-LOW POWER, NEAR SUB-VTH DEVICE STRUCTURES

(75) Inventors: Brent A. Anderson, Jericho, VT (US); Andres Bryant, Essex Junction, VT (US); William F. Clark, Jr., Essex Junction, VT (US); Jeffrey P. Gambino, Westford, VT (US); Shih-Fen Huang, Bedford Corners, NY (US); Edward J. Nowak, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 396 days.

(21) Appl. No.: 11/164,651

(22) Filed: Nov. 30, 2005

(65) Prior Publication Data

US 2007/0122957 A1    May 31, 2007

(51) Int. Cl.
*H01L 27/088* (2006.01)
(52) U.S. Cl. .................. 257/368; 257/288; 257/393
(58) Field of Classification Search ........... 257/E21.59, 257/393, 368, 288
See application file for complete search history.

(56) References Cited

U.S. PATENT DOCUMENTS

| | | | |
|---|---|---|---|
| 4,090,289 A * | 5/1978 | Dennard et al. ............ 438/294 |
| 4,182,023 A | 1/1980 | Cohen et al. | |
| 5,247,212 A | 9/1993 | Vinal | |
| 5,266,510 A | 11/1993 | Lee | |
| 5,850,090 A | 12/1998 | Oashi et al. | |
| 5,981,970 A | 11/1999 | Dimitrakopoulos et al. | |
| 6,100,120 A * | 8/2000 | Yu ............................ 438/151 |
| 6,344,660 B1 | 2/2002 | Dimitrakopoulos et al. | |
| 6,653,700 B2 | 11/2003 | Chau et al. | |
| 7,160,777 B2 * | 1/2007 | Choi et al. ................. 438/267 |
| 2005/0051836 A1 | 3/2005 | Choi et al. ................. 257/315 |

* cited by examiner

*Primary Examiner*—Michael B Shingleton
(74) *Attorney, Agent, or Firm*—Whitham, Curtis, Christofferson & Cook, P.C.; Michael K. LeStrange

(57) ABSTRACT

In order to reduce power dissipation requirements, obtain full potential transistor performance and avoid power dissipation limitations on transistor performance in high density integrated circuits, transistors are operated in a sub-threshold (sub-$V_{th}$) or a near sub-$V_{th}$ voltage regime (generally about 0.2 volts rather than a super-$V_{th}$ regime of about 1.2 volts or higher) and optimized for such operation, particularly through simplification of the transistor structure, since intrinsic channel resistance is dominant in sub-$V_{th}$ operating voltage regimes. Such simplifications include an underlap or recess of the source and drain regions from the gate which avoids overlap capacitance to partially recover loss of switching speed otherwise caused by low voltage operation, an ultra-thin gate structure having a thickness of 500 Å or less which also simplifies forming connections to the transistor and an avoidance of silicidation or alloy formation in the source, drain and/or gate of transistors.

15 Claims, 4 Drawing Sheets

Silicon – gate oxide – thin polysilicon – hardmask oxide stack

Pattern hard mask

Etch polysilicon, gateoxide

Sidewall spacer dep/growth

Form thicker Spacers (Dep and etch), Implant extensions

Dispose spacers, etch hardmask, junctions now weakly underlapped
Result is ultra-thin gate, underlapped, no-silicide FET optimized for
near-sub-Vt operation

LOW-COST FEOL FOR ULTRA-LOW POWER, NEAR SUB-VTH DEVICE STRUCTURES

BACKGROUND OF THE INVENTION

1. Field of the Invention

The present invention generally relates to field effect transistors for integrated circuits and, more particularly, to inexpensive, ultra-low power dissipation devices suitable for extremely high integration density and operation at high clock speeds which can be reliably fabricated with low process cost and minimal process complexity.

2. Description of the Prior Art

Increasing integration density in current integrated circuit designs of limited chip area has been driven by the potential for improved performance at increased clock speeds because of reduced signal propagation time and increased noise immunity resulting from increased proximity between electronic devices integrated on a semiconductor chip as well as the potential for increased functionality on a single chip while reducing process cost per device on a chip. However, since each electronic device, and active devices such as transistors, in particular, must dissipate some power at each switching transition and the amount of heat which can be dissipated from a chip of limited area at a temperature which does not produce damage in the chip is limited, it is power concerns which limit the performance of current integrated circuit designs, particularly microprocessors, and may even preclude further performance increases in the future.

More specifically, an ideal transistor would dissipate no power when it is in a conductive state since it would exhibit no resistance and would dissipate no power when it is in a non-conductive state because it would carry no current. However, even in an ideal transistor, power would be dissipated in the short interval during switching between conductive and non-conductive states and vice-versa since both current and resistance would be non-zero during such intervals. In practical devices, power is also dissipated during the conductive and non-conductive states as well since there will be some leakage current in the non-conductive state and a substantial resistance will be exhibited in a conductive state.

Therefore, it has generally been the practice in digital switching circuits to operate transistors with control voltages well above their switching thresholds (sometimes referred to as super-$V_{th}$) in order to achieve the highest possible ratio between so-called on-resistance and off-resistance (sometimes referred to as the on/off ratio or off/on resistance ratio) to minimize power dissipation during on and off periods as well as to achieve maximum noise immunity and signal voltage swing. However, the off/on resistance ratio is invariably reduced when transistor designs are scaled to smaller sizes to accommodate increased integration density and many modern integrated circuits operate with off/on resistance ratios as low as 100:1 or even less even when driven with signals well above the switching threshold $V_{th}$ (e.g. super-$V_{th}$ voltages) and highly sophisticated transistor designs have been developed to maintain even those resistance ratios to allow currently available minimum lithographic feature sizes to be exploited. In particular, so-called extension and halo implants, which may be complex in geometry and which generally overlap the gate, have been used to reduce conduction channel resistance while minimizing short-channel and other deleterious effects although the overlap causes increase in gate capacitance and some reduction in switching speed and increase of drive current requirement. Such reduction in switching speed and increase in gate capacitance are deemed to be tolerable to obtain improved off/on resistance ratio.

In this regard, so-called external resistance (e.g. the extrinsic series resistance in the source and drain and connections thereto at the ends of the transistor conduction channel) is an unavoidable component of the on resistance of the transistor and, although requiring expensive additional process steps (including annealing which may consume a significant portion of the overall manufacturing heat budget), silicidation (e.g. forming an alloy of the semiconductor material with a metal or combination of metals) of the gate and source and drain regions has been employed in many modern transistor designs in order to minimize resistance therein although such reduction in resistance also tends to slightly increase the gate to source/drain capacitance in some cases, particularly at the edges of the gate and especially where the source/drain and/or extension implants overlap the gate. Additionally, transistors having unsilicided source and drain regions were found to operate only poorly, if at all, in super-$V_{th}$ voltage regimes without overlap of the gate with source and drain regions or at least the extension implants due to the significant contributions to extrinsic series resistance of both the bulk semiconductor between the gate and the source/drain diffusions which the gate thus cannot control and the resistance of the source/drain regions themselves. Thus, the overlap capacitance was substantially unavoidable, especially without silicidation of the source and drain regions, and the process complexity incident thereto.

Such designs may often only be realized by complex and costly process sequences with significant loss of manufacturing yield and which may also limit the minimum sizes to which such designs may be scaled while the devices so fabricated may still be limited in performance by the ability to remove heat therefrom. Complex and costly cooling arrangements such as micro- and nano-structure fans, forced air or liquid cooling and the like have often been used to support marginal performance improvements for critical applications while heat dissipation remains a major limitation on obtaining the full theoretical performance levels of current and foreseeable integrated circuit designs.

Other approaches to the problem have included reduction in operating voltages (which also allows some additional scaling of structures to dimensions where electrical breakdown would otherwise occur) while operating with super-$V_{th}$ control voltages. However, circuit delays increase dramatically at reduced operating voltages due to reduced switching speed which may, in turn, limit the reduction in power dissipation which can be achieved (i.e. since the switching time then consumes a greater portion of a clock cycle, thus increasing the duty-cycle of relatively high power dissipation operation). However, at least functionally, some studies have shown that slow switching speed can be more than off-set in processing throughput by using a large degree of parallelism to achieve net gains in power limited performance although parallelism implies some increase in the overall numbers of active devices and size of logic circuitry; tending to reduce such a gain in power-limited performance, at least to some degree.

Therefore, it is seen that at the present state of the art, known improvements in integrated circuit design directed to avoiding limitation of performance by power dissipation have been largely exhausted and often do not allow the full potential performance of current integrated circuit designs to be achieved. Moreover, recent marginal improvements in integrated circuit performance have been achieved only by extremely aggressive transistor design which is of increasing incremental expense to fabricate, both in terms of process complexity and manufacturing yield, to realize diminishing increments of performance improvement and which are therefore becoming much less cost-efficient.

SUMMARY OF THE INVENTION

It is therefore an object of the present invention to provide a novel, cost efficient transistor design which is optimized for operation in a sub-$V_{th}$ or near sub-$V_{th}$ control voltage regime and at reduced supply voltage.

It is another object of the invention to provide a simplified transistor design for use in integrated circuits which may be reliably produced at extremely small sizes and close proximity for high integration density.

In order to accomplish these and other objects of the invention, an integrated circuit is provided including at least one field effect transistor operating at sub-$V_{th}$ voltages comprising a layer of semiconductor material, a gate structure, a junction underlapped with or recessed from the gate structure and defining source and drain regions in said layer of semiconductor material such that extrinsic resistance of said transistor is less than intrinsic on resistance of a channel region of said transistor when said transistor is operated in a sub-$V_{th}$ voltage regime or wherein the gate structure and the source and drain regions consist essentially of unalloyed semiconductor material.

In accordance with another aspect of the invention, a method of manufacture of an integrated circuit comprising steps of patterning a hard mask located on a layer of semiconductor material to define locations of gate stacks, forming gate stack structures in accordance with said patterning of said hard mask, implanting and diffusing impurities between said gate stacks in regions which underlap or are recessed from said gate stacks such that extrinsic series resistance of said transistor does not exceed intrinsic channel on-resistance of said transistor when said transistor is operated in a sub-$V_{th}$ voltage regime, and forming contacts to locations where said implanting step is performed without alloying said regions such that extrinsic series resistance of said transistor does not exceed intrinsic channel on-resistance of said transistor when said transistor is operated in a sub-$V_{th}$ voltage regime.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
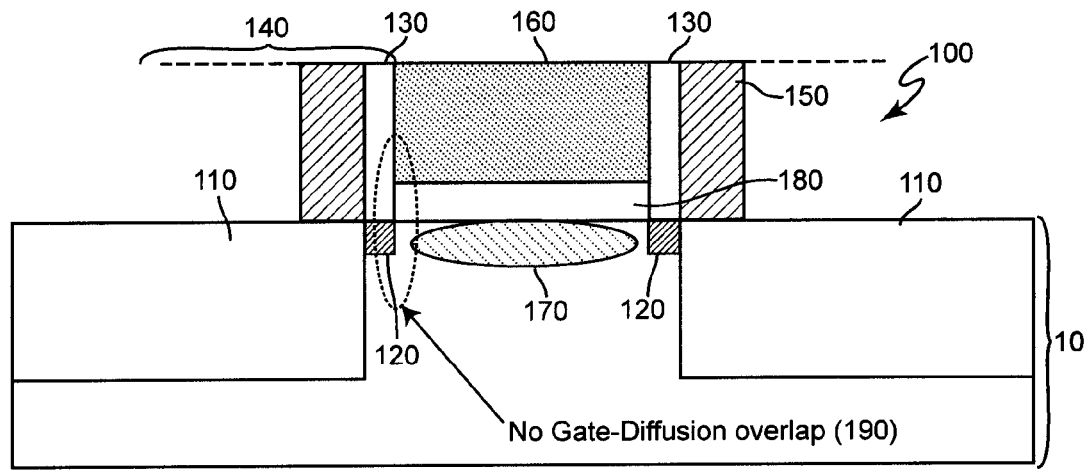
FIG. 1 is a cross-sectional view of a transistor in accordance with the invention including possible perfecting features thereof.

Referring now to the drawings, and more particularly to FIG. 1, there is shown a cross-sectional view of a field effect transistor (FET) in accordance with the invention. This Figure represents a limiting case of the transistor design disclosed in copending U.S. Pat. No. 7,099,265 B2, filed Jun. 11, 2004, and issued Mar. 7, 2006, assigned to the assignee of the present invention and hereby fully incorporated by reference. However, while this design includes a number of features which may be desirable in some applications, not all are necessarily required or even desirable in a high integration density, high performance integrated circuit operating in a sub-$V_{th}$ or near sub-$V_{th}$ regime in accordance with the present invention and thus should be regarded as optional perfecting features in the context of the present invention for use in particular applications.

It should be understood that the basic structure shown is equally applicable to both nFETs and pFETs which may be fabricated on and/or in a semiconductor substrate or layer (e.g. the active layer of a semiconductor-on-insulator substrate, impurity well or the like) of any semiconductor material (e.g. silicon, germanium, SiGe, etc.). It should also be appreciated that the transistor in accordance with the invention differs from conventional FET designs in several ways which may not be immediately evident from the cross-sectional view of FIG. 1, particularly since many cross-sectional views of conventional transistors in the literature are highly idealized and, to a degree, schematic, while the differences therefrom in accordance with the invention are largely counter-intuitive and contrary to conventional goals of transistor design while being largely insusceptible of illustration consistent with an idealized highly schematic illustration. However, points of difference which will be discussed in greater detail below, include but are not limited to source and drain implants/regions which are recessed (sometimes referred to as underlapped) from the gate structure, extension implants which do not overlap the gate structure and which are thus of low capacitance, an ultra-thin, low capacitance gate structure which reduces gate stack height relative to the surface at which the source and drain are formed, greatly simplifying contact formation processes and, preferably, a lack of silicide formation in the gate structure, and/or the source and/or drain regions of the transistor.

Figure 1A:
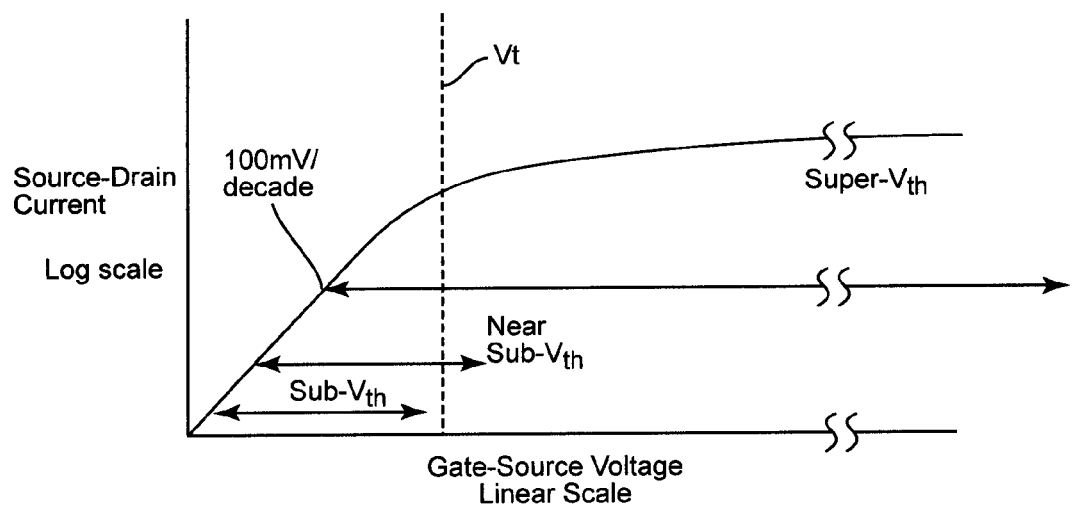
FIG. 1A is a graphical depiction of sub-$V_{th}$, near sub-$V_{th}$ and super-$V_{th}$ control voltage regimes.
Figure 2:
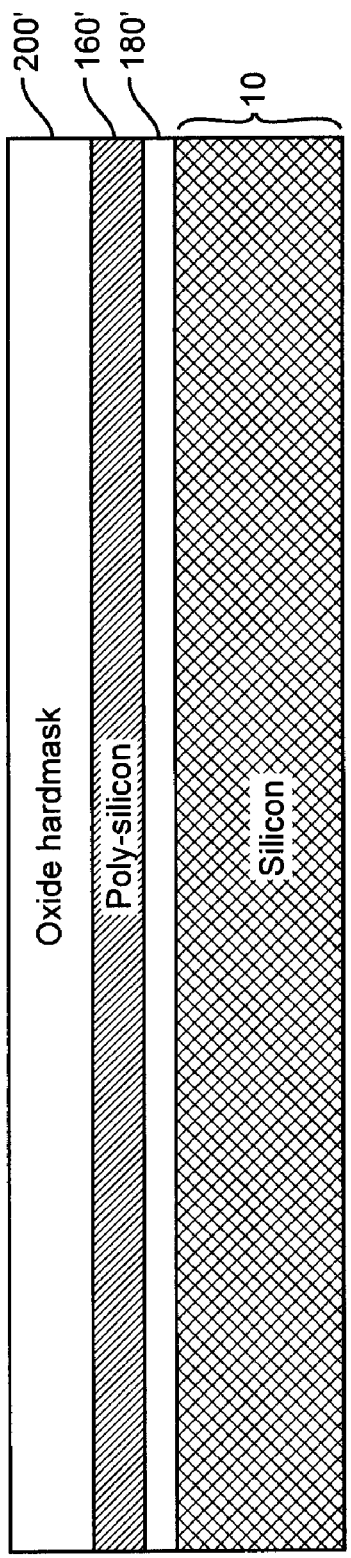
FIGS. 2, 3, 4, 5, 6 and 7 are cross-sectional views of intermediate stages of fabrication of the transistor of FIG. 1.

It should also be understood that the invention seeks to exploit operation in a sub-$V_{th}$ or near sub-$V_{th}$ control voltage regime which is, itself, counter-intuitive and contrary to the super-$V_{th}$ control voltage regime conventionally employed for digital circuits, as discussed above. More specifically, the threshold voltage, $V_{th}$, of an FET is defined as the gate voltage at the "knee" of the conduction characteristic curve of the transistor such as that shown in FIG. 1A (which also generally indicates the operating voltage ranges for sub-$V_{th}$, near sub-$V_{th}$ and super-$V_{th}$ operating voltage regimes) at which the source-drain current transitions from an exponential dependence on gate voltage (appearing as substantially linear in view of the logarithmic vertical scale of FIG. 1A) to a linear or quadratic dependence on gate voltage. As is known, $V_{th}$ varies with drain bias. For typical FETs used in microprocessors, $V_{th}$ is about 0.2 volts whereas common gate voltages for current FET designs are generally several times larger, for example, 1.2 volts which may be nominally about the same as the power supply voltage. Such higher, super-$V_{th}$ gate operating voltages provide the advantage of higher switching speed as well as maximized off/on resistance ratios.

In contrast with conventional current FET and integrated circuit designs, operation at very low sub-$V_{th}$ voltages causes device intrinsic channel resistance (particularly in the "on" state, i.e. the intrinsic on-resistance of the channel) to be dominant and it follows that extrinsic series resistance of the source, drain and extension regions is comparatively less important. At the same time, gate to source and drain capacitance due to overlap of the source and/or drain and/or extension implants with the gate in conventional transistor designs is a dominant source of performance degradation. Accordingly, the invention seeks to optimize the FET by minimizing overlap capacitance at the cost of relatively high extrinsic series resistance while holding channel resistance (and external or extrinsic series resistance) to acceptable levels. This design optimization criterion is very different from current super-$V_{th}$ technologies in which channel resistance is low and gate/diffusion underlap (e.g. a lack of overlap of the source/drain or extension implant with the gate) cannot be tolerated due to the high extrinsic series resistance in the region between the gate and the source/drain diffusion junction as well as exhibiting deleterious short channel effects, punch-through and the like. The FET design in accordance with the invention is further optimized by exploiting the tolerable (in comparison with the increased and dominant channel resistance in sub-$V_{th}$ operating regimes) high gate and diffusion resistance contributions to series resistance by providing ultra-thin gate stacks and, preferably, unsilicided source/drain regions which also reduces cost and process complexity while avoiding limitation on scaling to smaller sizes due to extension implant complexity and avoiding compromise of manufacturing yield by omitting the processes required to form such structures.

Again referring to FIG. 1, the FET 100 in accordance with the invention in the exemplary embodiment illustrated is similar to that disclosed in U.S. Pat. No. 7,009,265 B2, fully incorporated by reference above, comprises source/drain deep diffusions 110 in substrate or layer 10 which are recessed from the gate, optional diffusion extensions 120 contiguous with source/drain region 110 and extending approximately to the gate structure while being underlapped and not extending under it and possibly slightly recessed therefrom. The depth of the source/drain diffusions tends to reduce resistance thereof even if not silicided while the conduction channel may be maintained close to the surface of substrate or layer 10 by the extensions 120 which tends to improve the off/on resistance ratio.

The channel of the FET 100 may also have a doped region 170 between the extensions 120 preferably formed, if used, using a Damascene gate mandrel 140 which may be used as a hard mask for the implant. Such an implant may be used to further confine the conduction channel of the implant near the surface of substrate 10 and the gate structure and reduce the resistance of the conduction channel but has been found to be unnecessary to accomplish extremely high performance and low cost achieved by the invention through other improvements over the structure disclosed in the above-incorporated U. S. Patent Application. Similarly, while a Damascene gate structure may be preferable for some applications of the invention to particular integrated circuit designs, neither such a gate construction nor use of a Damascene mandrel are necessary to the successful practice of the invention and, in fact, are not preferred for general applications of the invention because of the cost thereof. In summary, while the above-incorporated U. S. Patent Application discloses a transistor structure fully optimized for operation in a sub-$V_{th}$ regime, it is not necessarily fully optimized for use in a high integration density integrated circuit operating in such a regime, as is the preferred embodiment of the present invention, due to the cost and complexity of features such as extension implants and channel doping which are regarded as perfecting features which can be used but are not preferred except in particular critical applications in accordance with the present invention due to cost and process complexity which may compromise manufacturing yield.

The gate stack structure is similarly non-critical to the practice of the invention but preferably includes a thin gate insulator 180 such as an oxide or high dielectric constant material(s) (referred to as "high-K" materials) and a gate conductor 160 which are preferably very thin as alluded to above and the preferred total thickness, while not critical to the successful practice of the invention, is preferably limited to about 500 Å or less with the gate oxide thickness held to about 10-100 Å. By way of comparison, minimum gate stack height for a super-$V_{th}$ operating range transistor is usually in the range of 1000-1700 Å even though such a gate stack height presents some process difficulties in lithographic contact formation. First spacers 130 and second spacers 150 are preferably provided and either or both may optionally be used to control source/drain and/or extension implants. However, it is to be understood that extension implants/diffusions are also not critical to the practice of the invention and, in fact, extension implants/diffusions are preferably omitted to reduce process complexity and such omission has been found to have relatively little effect on performance obtainable from high density integrated circuits including transistors in accordance with the basic principles of the present invention. In summary, while some of the features discussed above may be regarded as perfecting features of the present invention and the underlap (e.g. avoidance of overlap) of the gate and extension or source/drain regions are disclosed in detail in the above-incorporated U.S. Patent application, the invention, in accordance with its most basic principles, preferably omits extension regions 120 and channel doping 170 since high performance consistent with high and increased integration density can be achieved with a very simple structure which can be produced by a simplified process which will now be discussed in connection with FIGS. 2-7. The following process completes the transistors of an integrated circuit and the integrated circuit itself up to the point of application of further connections thereto and formation of additional components and devices such as logic and memory on the chip. For that reason, the process is also referred to as a front end of line (FEOL) process.

Figure 3:
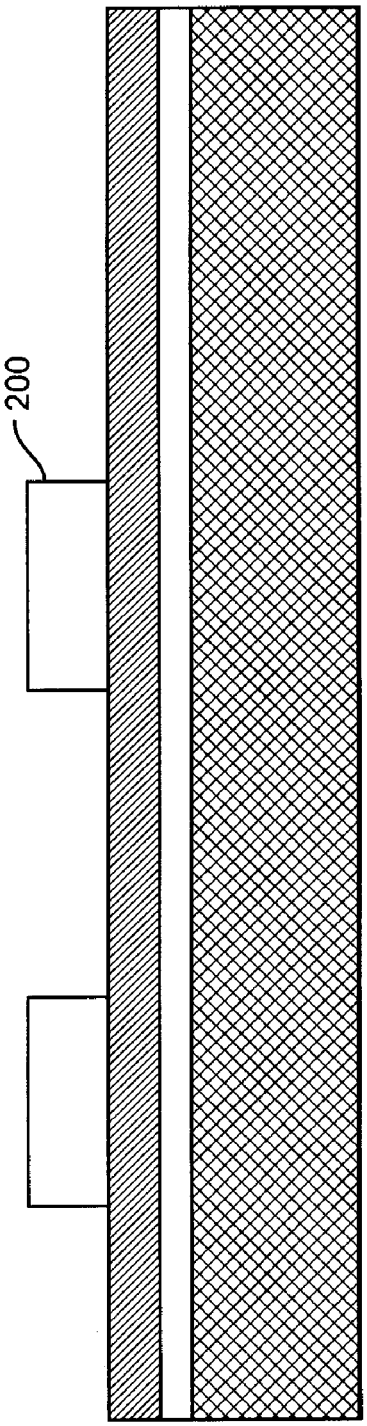
Figure 4:
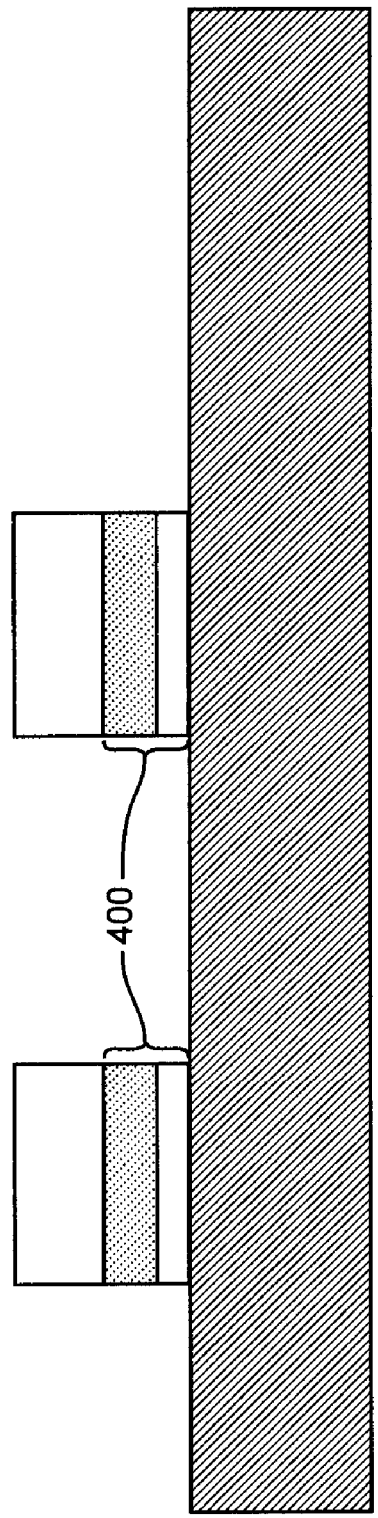

The preferred and simplified process to form a transistor with an underlapped source and drain and ultra-thin gate stack but without channel implant 170 or extension implants 120 begins with a substrate or layer 10 on which a gate oxide layer 180', a preferably polysilicon semiconductor layer 160' and an oxide hard mask (e.g. oxide) layer 200' are sequentially deposited. Alternatively any, all or any combination of these layers could be provided as layers in a previously manufactured wafer. However, it will generally be preferable to form these layers on substrate or layer 10 in order to control the quality and thickness of the gate oxide layer 180' and the overall gate stack thickness which is preferably very thin. Then, as shown in FIG. 3, hard mask layer 200' is patterned to yield mask portions 200 at the desired locations for gate structures. (Of course, if a Damascene gate structure and/or channel doping 170 is desired, etching of the hard mask layer 200' will be performed at the desired gate locations, as alluded to above, the channel implant made and the gate stack structure and hard mask replaced in a manner which will be apparent to those skilled in the art and which are discussed in detail in the above-incorporated U.S. Patent Application.) The gate structures are then formed by etching of layers 160' and 180' to form the gate stacks 400 as shown in FIG. 4. The hard mask can be left in place to facilitate later impurity implant step(s).

Figure 5:
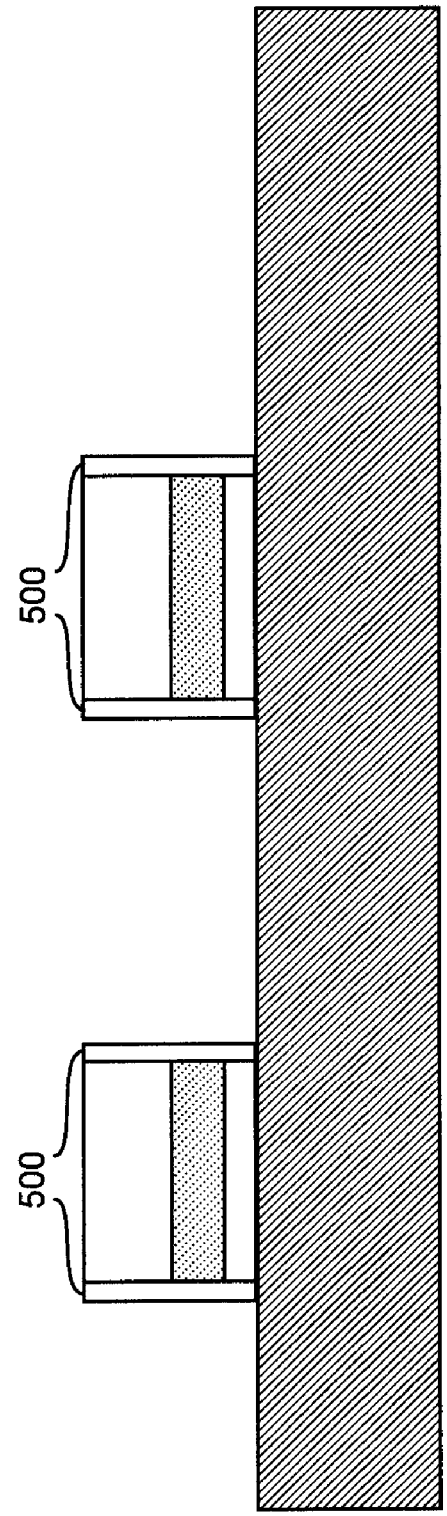
Figure 6:
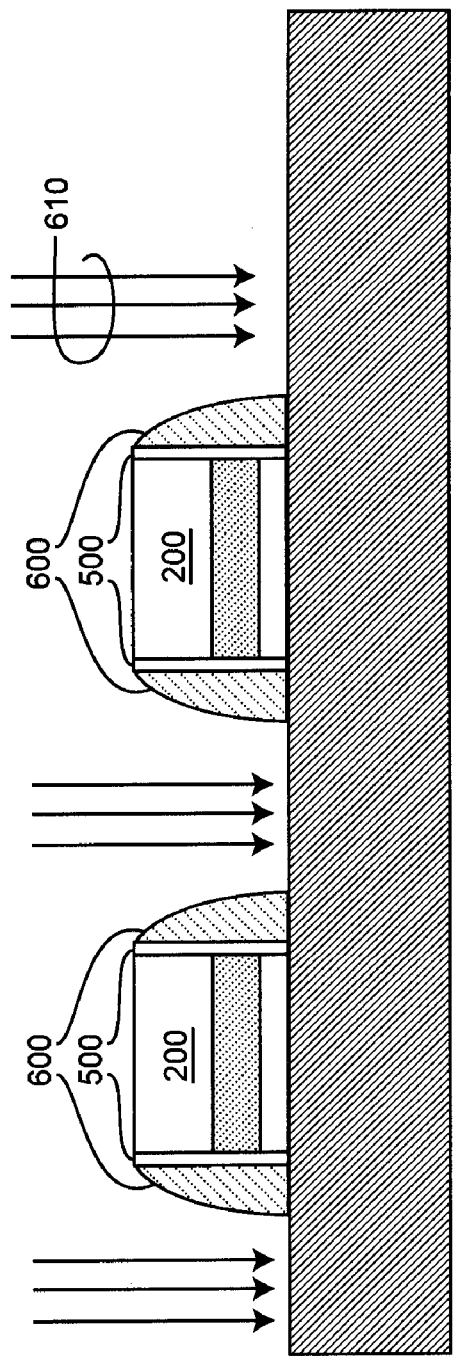

Then, as shown in FIG. 5 sidewall spacers 500 of a material which can be etched selectively to polysilicon and hard mask 200 are deposited and etched and/or grown (as is generally preferred for a first spacer if two spacers 500, 600 are used) on the sides of the gate stack and hard mask. This process is preferably continued to provide increased spacer thickness 600 with a material which can be etched selectively to the hard mask 200 and sidewall spacer 500 (so that spacer 500 can be left in place to protect edges of the gate oxide if spacer 600 is later removed, as is preferred) until a lateral thickness greater than a diffusion distance of impurities for source/drain diffusions of respective nFETs and pFETs is reached to assure the creation of an underlap (e.g. a recess from the gate stack structure) and avoidance of an overlap with the gate stack and will differ between the nFETs and pFETs due to differences in diffusion rates of boron phosphorus and/or arsenic which may be used in respective transistor conductivity types. In general, blanket isotropic deposition of sidewall material (e.g. oxide or nitride but possibly other materials providing the above-noted etch selectivity) followed by anisotropic etching is generally required to develop sufficient final sidewall thicknesses 600, as shown in FIG. 6.

Figure 7:
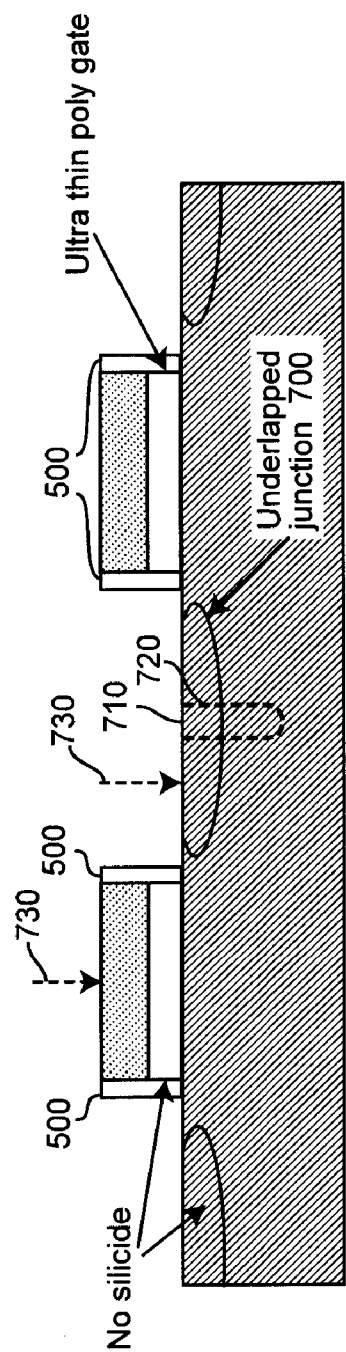

Then, using the sidewalls 600 and the hard mask, implantations 610 are performed followed by annealing to activate and diffuse the implanted impurity to form an underlapped junction 700 as illustrated in FIG. 7. As further shown in FIG. 7, the sidewalls 600 and hard mask 200 can now be and preferably are removed. Removal of both structures can be performed by a single selective etch if of materials which exhibit comparable etch rates for an etchant which is selective to the material of substrate 10 and the gate stack structure which the above noted, selectively etchable materials of hard mask 200, and sidewall spacers 500 serve to protect.

The transistor structures are now essentially complete since it is preferred to avoid silicidation of the gate, source and drain while forming contacts 730 thereto by any known technique such that they consist essentially of unalloyed semiconductor material since, in accordance with the invention, the reduction of gate capacitance due to the underlap/recess of the source and drain diffusions has been found to be far more beneficial than the possible performance gain from reduced source/drain resistance. That is, even if the source and drain are not silicided, the extrinsic series resistance will be comparable to and generally not significantly greater than the channel resistance (although channel resistance may be reduced somewhat by provision of doping 170 as discussed above) when the transistor is operated in the sub-$V_{th}$ or near sub-$V_{th}$ control voltage regime to reduce power dissipation requirements. Generally, extension implants, while possible as a perfecting feature consistent with the invention will not provide significant improvement in conduction characteristics during operation in sub-$V_{th}$ and near sub-$V_{th}$ regimes sufficient to justify the required increase in process complexity. Also, in FIG. 7, the underlapped junction 700 forms common source and drain regions of separate transistors which is often desirable in CMOS circuits. However, the transistors can be separated by initial formation of an isolation structure 710 in the substrate or layer 10 prior to the above-described process (e.g. prior to the step illustrated in FIG. 2) or by etching a trench 720 and depositing an isolation structure 710 subsequent to the implantation step of FIG. 6 or in other ways which will be evident to those skilled in the art.

It should be appreciated from the foregoing that the process described above in connection with FIGS. 2-7 is of minimal complexity and can be performed reliably, repeatably and with high manufacturing yield even when the transistors are scaled to dimensions comparable with minimum lithographic feature sizes at the present and foreseeable state of the art. It should also be appreciated that the transistor structure resulting from this minimally complex process is essentially optimized for operation in a sub-$V_{th}$ or near sub-$V_{th}$ control voltage regime and is of much improved performance since gate to source and/or drain diffusion capacitance is minimized while gate electrode thickness is minimized (and gate insulator thickness reduced below thicknesses required in known transistor designs in accordance with operation at lower voltages) by the development of an ultra-thin gate stack (which also simplifies contact formation by virtue of the gate surface being a shorter distance above the substrate where the source and drain are formed); increasing switching speed while reducing drive requirements and establishing improved control over channel conduction and generally improving the potential off/on resistance ratio which can be obtained consistent with maximal integration density which also increases noise immunity and usable clock rates which are not limited by power dissipation concerns due to operation at a much reduced voltage compared with conventional integrated circuits.

In view of the foregoing, it is seen that the invention provides an integrated circuit including a novel transistor design which can be reliably produced at high manufacturing yield by a process of minimal complexity even when produced at the minimum available lithographic feature size in integrated circuits of maximum integration density and which provides high performance which is not power dissipation limited at a high off/on resistance ratio. Perfecting features discussed in connection with FIG. 1 can be added with tolerable process complexity when relatively slight further improvements in performance are critical to a given application of the invention.

While the invention has been described in terms of a single preferred embodiment, those skilled in the art will recognize that the invention can be practiced with modification within the spirit and scope of the appended claims.

What is claimed is:

1. An integrated circuit including at least two field effect transistors operating at sub-$V_{th}$ voltages, said at least two field effect transistors comprising:
    a layer of semiconductor material,
    a gate structure,
    a region containing an impurity within said layer of semiconductor material and between but recessed from said gate structure of respective ones of said at least two transistors such that said region forms a source or drain structure for said at least two transistors such that said source or drain structure does not extend under said gate structures and a junction is formed which does not extend under said gate structure, wherein
    said gate structure and said source or drain structure consist essentially of unalloyed semiconductor material such that extrinsic series resistance of said at least two transistors will be comparable to and not significantly greater than channel resistance of a transistor of said at least two transistors in said layer of semiconductor material when said transistor is operated in a sub-$V_{th}$ regime.

2. The integrated circuit as recited in claim 1 wherein said gate structure has a total thickness not exceeding 500 Å.

3. An integrated circuit as recited in claim 1 wherein said junction is formed as a diffusion which is common to two adjacent transistors.

4. An integrated circuit as recited in claim 1 wherein said transistor further includes
    an extension implant.

5. An integrated circuit as recited in claim 4 wherein said extension implant extends to but does not overlap said gate structure.

6. An integrated circuit as recited in claim 1 wherein said transistor further includes
    a Damascene gate mandrel.

7. An integrated circuit as recited in claim 1 wherein said transistor further includes channel doping.

8. An integrated circuit as recited in claim 1 further including an isolation structure between transistors.

9. An integrated circuit including at least one transistor, said transistor including
- a layer of semiconductor material,
- a gate stack formed on said layer of semiconductor material, said gate stack having a thickness of 500 Å or less and including a layer of high-K dielectric material having a thickness in a range of 10 Å-100 Å, and
- source and drain diffusions recessed from said gate structure in a direction parallel to a surface of said layer of semiconductor material such that said source and drain diffusions do not extend under said gate stack and such that extrinsic resistance of said transistor is less than intrinsic on resistance of a channel region of said transistor when said transistor is operated in a sub-$V_{th}$ voltage regime.

10. An integrated circuit as recited in claim 9 wherein said junction is formed as a diffusion which is common to two adjacent transistors.

11. An integrated circuit as recited in claim 9 wherein said transistor further includes
- an extension implant.

12. A method of manufacture of an integrated circuit comprising steps of
- patterning a hard mask located on a layer of semiconductor material to define locations of gate stacks,
- forming gate stack structures in accordance with said patterning of said hard mask,
- implanting and diffusing impurities between said gate stacks in regions which are recessed from said gate stacks such that implanted and diffused impurities do not extend under said gate stack structures and extrinsic series resistance of said transistor does not exceed intrinsic channel on-resistance of said transistor when said transistor is operated in a sub-$V_{th}$ voltage regime and such that extrinsic series resistance of said transistor is comparable to and does not significantly exceed channel resistance of said transistor when operated in a sub $V_{th}$ regime, and
- forming contacts to locations where said implanting step is performed without alloying said regions.

13. The method as recited in claim 12, further comprising a step of forming an isolation structure between transistors of said integrated circuit.

14. The method of claim 13, wherein said implanting step includes a step of
- defining a distance by which said impurities are recessed in said implanting and diffusing step by forming a sidewall on said gate stack structure.

15. The method of claim 13 wherein said step of forming contacts is such that source and drain regions consist essentially of unalloyed doped semiconductor material.

* * * * *